US008617965B1

(12) United States Patent
Quick et al.

(10) Patent No.: US 8,617,965 B1
(45) Date of Patent: Dec. 31, 2013

(54) APPARATUS AND METHOD OF FORMING HIGH CRYSTALLINE QUALITY LAYER

(75) Inventors: Nathaniel R. Quick, Lake Mary, FL (US); Aravinda Kar, Oviedo, FL (US)

(73) Assignee: Partial Assignment to University of Central Florida

( * ) Notice: Subject to any disclaimer, the term of this patent is extended or adjusted under 35 U.S.C. 154(b) by 0 days.

(21) Appl. No.: 11/410,713

(22) Filed: Apr. 25, 2006

Related U.S. Application Data

(63) Continuation-in-part of application No. 11/062,011, filed on Feb. 18, 2005, now Pat. No. 7,618,880.

(60) Provisional application No. 60/546,564, filed on Feb. 19, 2004.

(51) Int. Cl.
*H01L 21/00* (2006.01)

(52) U.S. Cl.
USPC .......................................... 438/478

(58) Field of Classification Search
USPC ........................................ 438/478, 483, 798
See application file for complete search history.

(56) References Cited

U.S. PATENT DOCUMENTS

| 3,214,315 A | 10/1965 | Hildebrand |
| 3,396,401 A | 8/1968 | Nonomura |
| 3,419,321 A | 12/1968 | Barber et al. |
| 3,605,469 A | 9/1971 | Queralto |
| 3,788,120 A | 1/1974 | Takeo et al. |
| 3,854,123 A | 12/1974 | Banach |
| 3,865,564 A | 2/1975 | Jaeger et al. |
| 3,874,240 A | 4/1975 | Rembaum |
| 3,943,324 A | 3/1976 | Haggerty |
| 3,944,640 A | 3/1976 | Haggerty et al. |
| 3,945,318 A | 3/1976 | Landsman |
| 3,965,328 A | 6/1976 | Locke |
| 3,981,705 A | 9/1976 | Jaeger et al. |
| 4,043,170 A | 8/1977 | Erodi et al. |
| 4,135,902 A | 1/1979 | Oehrle |
| 4,142,088 A | 2/1979 | Hirsch |

(Continued)

FOREIGN PATENT DOCUMENTS

| JP | 358095830 A | 6/1983 |
| JP | 405024975 A | 2/1993 |
| WO | WO 03013757 | 2/2000 |

OTHER PUBLICATIONS

Nathaniel R. Quick, Laser Conversion of Ceramic Materials to Electroconductors, International Conference on Electronic Materials—1990, Materials Research Society, Newark, New Jersey, Sep. 17-19, 1990.

(Continued)

Primary Examiner — Savitr Mulpuri
(74) Attorney, Agent, or Firm — Frijouf Rust & Pyle P.A.

(57) ABSTRACT

A method is disclosed for making a high crystalline quality layer in a surface region of a wide bandgap material substrate. The high crystalline quality layer is formed by directing a thermal energy beam onto the wide bandgap material in the presence of a doping gas for converting a layer of the wide bandgap material into the high crystalline quality layer. Various electrical, optical and electro-optical components may be formed within the high crystalline quality layer through a further conversion process. In an alternative embodiment, the high crystalline quality layer may be embedded within the wide bandgap material.

8 Claims, 6 Drawing Sheets

(56) References Cited

U.S. PATENT DOCUMENTS

| | | | |
|---|---|---|---|
| 4,159,414 A | 6/1979 | Suh et al. | |
| 4,215,263 A | 7/1980 | Grey et al. | |
| 4,309,224 A | 1/1982 | Shibata | |
| 4,339,285 A | 7/1982 | Pankove | |
| 4,372,989 A | 2/1983 | Menzel | |
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Baeuerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Shirahata et al. | |
| 4,840,853 A | 6/1989 | Lio et al. | |
| 4,847,138 A | 7/1989 | Boylan et al. | |
| 4,860,442 A | 8/1989 | Ainsworth et al. | |
| 4,872,923 A | 10/1989 | Borodin | |
| 4,880,770 A | 11/1989 | Mir et al. | |
| 4,901,550 A | 2/1990 | Koide | |
| 4,912,063 A * | 3/1990 | Davis et al. | 117/97 |
| 4,912,064 A * | 3/1990 | Kong et al. | 438/507 |
| 4,912,087 A | 3/1990 | Aslam et al. | |
| 4,924,033 A | 5/1990 | Iyogi et al. | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,055,967 A | 10/1991 | Sukonnik et al. | |
| 5,127,364 A | 7/1992 | Savkar et al. | |
| 5,145,741 A | 9/1992 | Quick | |
| 5,149,681 A | 9/1992 | Ohkawa et al. | |
| 5,180,440 A | 1/1993 | Siegel et al. | |
| 5,336,360 A | 8/1994 | Nordine | |
| 5,391,841 A | 2/1995 | Quick | |
| 5,405,481 A | 4/1995 | Licoppe et al. | |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,759,908 A | 6/1998 | Steckl | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A | 4/2000 | Quick | |
| 6,064,081 A | 5/2000 | Robinson et al. | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk, Jr. et al. | |
| 6,271,576 B1 | 8/2001 | Quick | |
| 6,274,234 B1 | 8/2001 | Dujardin et al. | |
| 6,303,473 B1 * | 10/2001 | Heffernan et al. | 438/483 |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,526,327 B2 | 2/2003 | Kar et al. | |
| 6,621,448 B1 | 9/2003 | Lasky et al. | |
| 6,670,693 B1 | 12/2003 | Quick | |
| 6,703,294 B1 * | 3/2004 | Schoner et al. | 438/519 |
| 6,732,562 B2 | 5/2004 | Quick et al. | |
| 6,930,009 B1 | 8/2005 | Quick | |
| 6,939,748 B1 | 9/2005 | Quick | |
| 7,237,422 B2 | 7/2007 | Quick | |
| 7,268,063 B1 | 9/2007 | Quick | |
| 7,419,887 B1 | 9/2008 | Quick | |
| 2004/0053438 A1 * | 3/2004 | Abe et al. | 438/93 |

OTHER PUBLICATIONS

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91, The Society for Optical & Quantum Electronics, pp. 537-544 San Diego, CA Dec. Sep. 13, 1991.

Nathaniel R. Quick and Richard J. Matson, Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92, The Society for Optical & Quantum Electronics, pp. 881-887 Houston, Texas Dec. 7-10, 1992.

Nathaniel R. Quick, Characterization of a Ceramic Thermal Sensor Synthesized by a Laser Concersion Process, ICALEO '92 (International Congress on Applications of Lasers and Electro-Optics), vol. 75 Laser Materials Processing, Laser Institute of America, pp. 394-404 Oct. 25-29, 1992.

D. K. Sengupta, N. R. Quick and A. Kar, Laser Direct Write of Conducting and Insulating Tracks in Silicon Carbide, Materials Research Society Symposium Proceedings vol. 624 pp. 127-133 2000.

D. K. Sengupta, N. R. Quick and A. Kar, Laser Conversion of Electrical Properties for Silicon Carbide Device Applications, Journal of Laser Applications., 2001, vol. 13, pp. 26-31.

I.A. Salama, N.R. Quick and A. Kar, Laser Doping of Silicon Carbide Substrates, Journal of Electronic Materials, vol. 31, 2002, pp. 200-208.

I.A. Salama, N. R. Quick and A. Kar, Microstructurel and electrical resistance analysis of laser-processed SiC substrates for wide bandgap semiconductor materials, Journal of Materials Science, vol. 40, 2005, pp. 3969-3980.

I.A. Salama, N. R. Quick and A. Kar, Laser Synthesis of Carbon-Rich SiC Nanoribbons, Journal of Applied Physics, vol. 93, 2003, pp. 9275-9281.

I.A. Salama, N.R. Quick, and A. Kar, Laser Direct Write Doping of Wide-Bandgap Semiconductor Materials, IEEE ICSC 2003 Proceedings.

A. Salama, C. F. Middleton, N. R. Quick G. D. Boreman and A. Kar, Laser-Metallized Silicon Carbide Schottky Diodes for Millimeter Wave Detection and Frequency Mixing, Symposium N1 Nitride and Wide Bandgap Semiconductors for Sensors, Photonics and Electronics IV, 204th Meeting of the Electrochemical Society, Orlando, Florida Oct. 12-16, 2003.

A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24 2003.

I. A. Salama, N. R. Quick and A. Kar, Laser-induced Dopant Incorporation in Wide Bandgap Materials: SiC and GaN, ICALEO 2003 (International Congress on Applications of Lasers and Electro-Optics) Proceedings, 2003.

I.A. Salama, N. R. Quick, and A. Kar, Laser Direct Writing and Doping of Diamond-like Carbon, Polycrystalline Diamond and Single Crystal Silicon Carbide, Journal of Laser Applications, vol. 16, 2004, pp. 92-99.

Z. Tian, N. R. Quick and A. Kar, Laser Direct Write and Gas Immersion Laser Doping Fabrication of SiC Diodes, J: Silicon Carbide Materials, Procesing and Devices, Symposium J Apr. 14-15, 2004.

Z. Tian, N. R. Quick and A. Kar, Laser Doping of Silicon Carbon and PIN Diode Fabrication, 23rd International Congress on Applications of Lasers & Electro-Optics 2004.

(56) References Cited

OTHER PUBLICATIONS

A. Kar and N. R. Quick, Laser Processing for Wide Bandgap Semiconductor Device Fabrication, 2004 Meeting of Optical Society of America, 2004.

Z. Tian, I.A. Salama, N. R. Quick and A. Kar, Effects of Different laser Sources and Doping Methods used to Dope Silicon Carbide, Acta Materialia, vol. 53, 2005, pp. 2835-2844.

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.

Z. Tian, N. R. Quick and A. Kar; Characteristics of 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of CO2 Laser Drilling of Microvias in High Density Flip Chip Substrates, ICALEO 2005 (International Congress on Applications of Lasers and Electro-Optics), Laser Institute of America, Oct. 31-Nov. 3, 2005.

Chong Zhang, S. Bet, A. Salama, N. R. Quick and A. Kar, CO2 Laser Drilling of Microvias Using Diffractive Optics Techniques: I Mathematical Modeling, InterPack 05, The ASME/Pacific Rim Technical Conference on Integration and Packaging of MEMS, NEMS and Electronic Systems, San Francisco, CA Jul. 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N. R. Quick and A. Kar, Laser-enhanced diffusion of nitrogen and aluminum dopants in silicon carbide, Acta Materiallia, vol. 54, 2006, pp. 4273-4283.

Z. Tian, N. R. Quick and A. Kar,Laser Direct Write Doping and Metallization Fabrication of Silicon Carbide Pin Diodes, Materials Science Forum, vols. 527-529, 2006, pp. 823-826.

S. Dakshinamurthy, N.R. Quick and A. Kar, SiC-based Optical Interferometry at high pressures and temperatures for pressure and chemical sensing, Journal of Applied Physics, vol. 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Lser-Fabricated Diodes on Endotaxial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, S. Bet and A. Kar, Laser Doping Fabrication of Energy Conversion Devices Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N.R. Quick and A. Kar, Laser-Doping of Silicon Carbide for p-n Junction and LED Fabrication, Physica Status Solidi (A), vol. 204, No. 4, 2007, pp. 1147-1157.

S. Dakshinamurthy, N.R. Quick and A. Kar, Temperature-dependent Optical Properties of Silicon Carbide for Wireless Temperature Sensors, Journal of PhysicsD: Applied Physics 40 (2007)353-360.

S. Dakshinamurthy, N.R. Quick and A. Kar, High temperature optical properties of silicon carbide for wireless thermal sensing, Journal of Physics D: Applied Physics, vol. 40, No. 2, 2007, pp. 353-360.

Chong Zhang, A. Salama, N.R. Quick and A. Kar, Determination of Thermophysical Properties for Polymer Films using Conduction Analysis of Laser Heating, International Journal of Thermophysics, vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for QWhite Light Emitting Diodes, Laser Institute of America, Journal of Laser Applications Vo. 20 No. 1 pp. 43-49 Feb. 2008.

Z. Tian, N. R. Quick and A. Kar, Laser Endotaxy in Silicon Carbide and PIN Diode Fabrication, Laser Institute of America, Journal of Laser Applications, vol. 20 No. 2 pp. 106-115, May 2008.

I. Salama, N. Quick and A. Kar, Laser Direct Write Dopinmg of Wide-Bandgap Semiconductor Materials, ISCS 2003 Proceedings ,2003.

I. Salama, N. Quick and A. Kar, Laser Microprocessing of Wide Bandgap Materials, Proceedings of International Congress on Laser Advanced Materials Processing (LAMP 2002).

* cited by examiner

APPARATUS AND METHOD OF FORMING HIGH CRYSTALLINE QUALITY LAYER

CROSS-REFERENCE TO RELATED APPLICATIONS

This is a continuation-in-part of U.S. patent application Ser. No. 11/062,011 filed Feb. 18, 2005 now U.S. Pat. No. 7,618,880. U.S. patent application Ser. No. 11/062,011 claims benefit of U.S. Patent Provisional application Ser. No. 60/546,564 filed Feb. 19, 2004. All subject matter set forth in U.S. patent application Ser. No. 11/062,011 and U.S. provisional application Ser. No. 60/546,564 is hereby incorporated by reference into the present application as if fully set forth herein

BACKGROUND OF THE INVENTION

1. Field of the Invention

This invention relates to wide bandgap materials and more particularly an article comprising a high crystalline quality layer formed in a wide bandgap material and the method of forming a high crystalline quality layer. The invention relates further to an improved component such as wide bandgap semiconductor device formed within the high crystalline quality layer.

2. Background of the Invention

Presently, silicon and gallium arsenide are the dominant conventional semiconductor materials used in the manufacture of semiconductor devices. Silicon and gallium arsenide are considered non-wide bandgap semiconductors. In contrast, wide bandgap semiconductors have superior properties including breakdown field, dielectric constant, thermal conductivity and saturated electron drift velocity. Unfortunately, wide bandgap semiconductors are expensive due to high processing costs and poor yields emanating from wafer growth through device packaging.

Ceramic substrates having wide bandgap semiconductor compositions, such as silicon carbide (SiC) and aluminum nitride (AlN), are known to exhibit electrical properties ranging from insulating electrical properties, semiconducting electrical properties and conducting electrical properties.

The wide-bandgap semiconductor phases of ceramics and other wide-bandgap semiconductors including diamond are used to create devices such as conductive tabs, interconnects, vias, wiring patterns, resistors, capacitors, semiconductor devices and the like electronic components by laser synthesis on the surfaces and within the body of such wide-bandgap semiconductors to thereby eliminate photolithography processes which require numerous steps and generate undesirable chemical pollutants when processing such traditional electronic devices, components and circuitry.

It is well known that alumina (Al2O3) dominates the dielectric market as an integrating substrate or device carrier in electronics packaging. Boron nitride (BN), aluminum nitride (AlN), silicon carbide (SiC) and diamond are also of interest due to the thermal coefficient of expansion (TCE) and for the dielectric constant and higher thermal conductivity than that of aluminum oxide (Al2O3). Silicon carbide (SiC), aluminum nitride (AlN), boron nitride (BN), gallium nitride (GaN) and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as aluminum nitride (AlN) and silicon carbide (SiC), have not been completely solved. Copper and silver paste exhibits a thermal coefficient of expansion (TCE) mismatch aggravated by high temperatures as well as being subject to oxidation that increases the resistivity. In particular, bonding of copper to aluminum nitride (AlN) has proved to be nontrivial. Alumina or stoichiometric aluminum oxynitride (AlON) coatings must be developed on the aluminum nitride (AlN) surface through passivation processes. These passivation processes have poor reproducibility. Thus, the direct laser synthesis of conductors in aluminum nitride (AlN), silicon carbide (SiC) and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

Many commerically available wafers of wide band gap material contain impurities such as substitutional atoms, and numerous lattice defects including lattice vacancies, dislocations and micropipes. These impurities and lattice defects result in a low resistivity for the wide bandgap material. The low resistivity makes the wide bandgap material unsuitable as a defect free intrinsic semiconductor for fabricating defect free devices and isolating devices.

One example of a commercially available wide band gap material is silicon carbide wafer SiC. A conventionally processed silicon carbide SiC wafer contains processed induced defects including 1) carbon vacancies created by the displacement of carbon atoms from lattice to interstitial sites, 2) substitutional nitrogen atoms located in the carbon vacancies, 3) dislocations, 4) stacking faults and 5) micropipes. The above defects render the silicon carbide wafer SiC unsuitable for use as a defect free intrinsic semiconductor for fabricating defect free devices and isolating devices.

One conventional approach is to create a high quality layer or thin film on the wide bandgap material. An external layer (epitaxy layer) is deposited upon an external surface of the commercially available wafers of the wide bandgap material. Typically, the external layer (epitaxy layer) is applied to the external surface of the commercially available wafers by chemical vapor deposition (CVD), molecular beam epitaxy (MBE) or liquid phase epitaxy techniques. The wafers of wide bandgap material serve as a seed substrate and the external layer (epitaxy layer) is grown on top of the seed substrate. Unfortunately, defects and/or impurities in the underlying wide bandgap material can migrate or travel into the external layer (epitaxy layer).

Completely different methods of processing material such as wide bandgap materials are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576, U.S. Pat. No. 6,670,693, U.S. Pat. No. 6,930,009 and U.S. Pat. No. 6,939,748 are hereby incorporated by reference into the present application.

The prior invention disclosed in U.S. patent application Ser. No. 11/062,011 filed Feb. 18, 2005 and U.S. Provisional application Ser. No. 60/546,564 filed Feb. 19, 2004 disclosed an apparatus and a process for forming a layer of a wide bandgap material in a non-wide bandgap material. The present invention seeks to improve upon the prior invention disclosed in U.S. patent application Ser. No. 11/062,011 and U.S. Provisional application Ser. No. 60/546,564.

Therefore, it is an object of the present invention to provide an apparatus and method for forming a high crystalline quality layer (endolayer) within a wide bandgap substrate.

Another object of this invention is to provide an apparatus and method for forming a high crystalline quality layer (endolayer) integral within the wide bandgap substrate.

Another object of this invention is to provide an apparatus and method for forming a high crystalline quality layer (endolayer) within a wide bandgap substrate suitable for use as a defect free intrinsic semiconductor material.

Another object of this invention is to provide an apparatus and method for forming a high crystalline quality layer (endolayer) within a wide bandgap substrate and for subsequently forming a component within the high crystalline quality layer (endolayer).

Another object of this invention is to provide an apparatus and method for forming a high crystalline quality layer (endolayer) within a wide bandgap substrate that forms a continuous or diffuse boundary as opposed to a discrete boundary and matches the thermal coefficient of thermal expansion of the parent substrate that prevents introduction of mobile defects into the endolayer.

Another objective of this invention is to provide a defect free intrinsic wide bandgap semiconductor material for defect free devices and device isolation.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a method of forming a high crystalline quality layer within a wide bandgap material having crystalline defects. The method comprises providing a substrate of a wide bandgap material having crystalline defects. A doping gas is applied to the wide bandgap material. A thermal energy beam is directed onto the wide bandgap material in the presence of the doping gas for donating atoms into the crystalline defects for creating a layer of high crystalline quality layer within a wide bandgap material.

In a more specific example of the invention, the substrate of the wide bandgap material includes selecting the substrate from the group consisting of a silicon carbide, aluminum nitride, diamond, diamond-like-carbon, gallium nitride and boron nitride. The doping gas applied to the wide bandgap material has at least one element common to the wide bandgap material. Preferably, the doping gas is selected from the group consisting of methane or acetylene or a nitrogen doping gas.

In another example of the invention, the thermal energy beam is selected from the group consisting of a beam of charged particles, a beam of electrons, a beam of ions or a beam of electromagnetic radiation directed onto the layer for converting the layer into a wide bandgap material. In the preferred form of the invention, the thermal energy beam is a laser beam.

The thermal energy beam creates a high crystalline quality endolayer within the wide bandgap material. A second thermal energy beam may be directed onto the high crystalline quality endolayer for creating an electrical component within the high crystalline quality layer in the wide bandgap material.

In a more specific example, the invention comprises a method of forming a high crystalline quality layer within a low crystalline quality silicon carbide material. The method comprises a substrate of a silicon carbide material having a low crystalline quality. A doping gas is applied to the silicon carbide material. A thermal energy beam is directed onto the silicon carbide material in the presence of the doping gas for converting a layer of the low crystalline quality silicon carbide material into a high crystalline quality layer within the silicon carbide material.

The doping gas has at least one element common to the silicon carbide material. Preferably, the doping gas is selected from the group consisting of silane, methane, acetylene, trimethylaluminum, nitrogen, diborane and triethyl gallium.

The invention is also incorporated into an improved component comprising a substrate of a low crystalline quality wide bandgap material and a high crystalline quality layer of wide bandgap material formed in situ within a region of said low crystalline quality wide bandgap material. An electrical device may be formed in the high crystalline quality layer.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
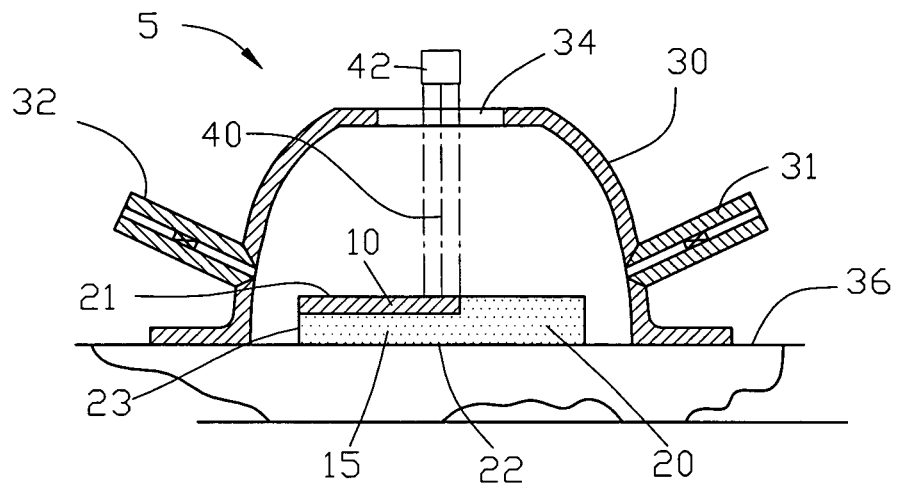
FIG. 1 is a side view of an air-tight chamber with a thermal energy beam impinging on a non-wide bandgap material for forming a layer of a wide bandgap material in the non-wide bandgap material.

FIG. 1 is a side view of an apparatus 5 for forming a layer of a wide bandgap material 10 in a non-wide bandgap material 15. The non-wide-bandgap material 15 is shown as a substrate 20 located in an air-tight chamber 30. The chamber 30 has an inlet and valve combination 31 and outlet and valve combination 32 connected to the side wall of the chamber 30 for injecting and removing gases into and therefrom, respectively. The chamber 30 includes an airtight transmission window 34. The chamber 30 is disposed on a support member 36 forming an airtight seal therewith.

Figure 2:
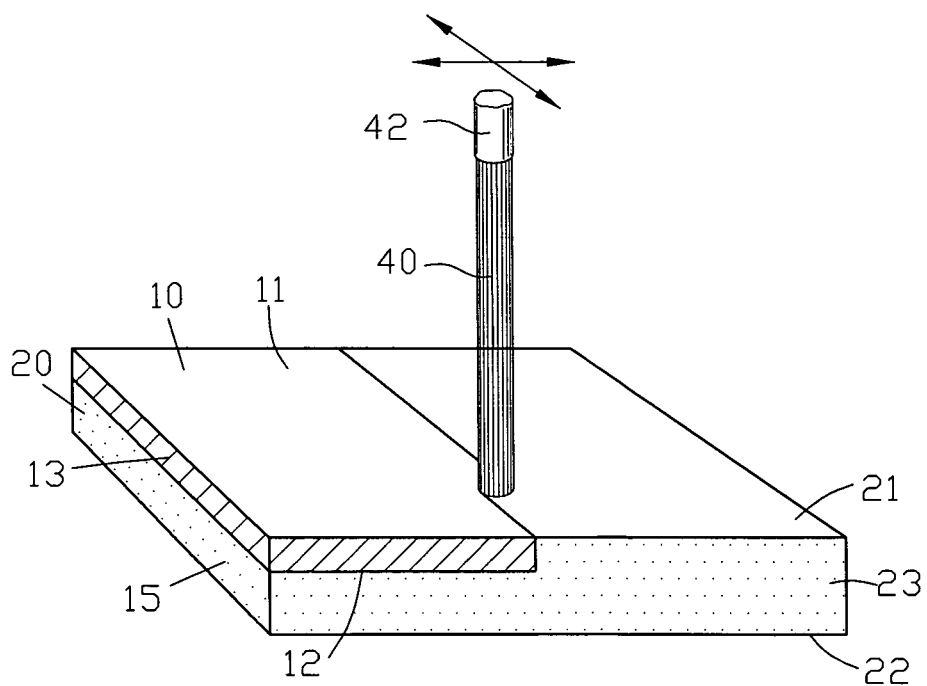
FIG. 2 is an enlarged isometric view of the layer of the wide bandgap material formed in the non-wide bandgap material.

FIG. 2 is an enlarged isometric view of the wide bandgap material 10 formed in the substrate 20 shown in FIG. 1. The wide bandgap material 10 defines a first and a second surface 11 and 12 and a peripheral edge 13. The substrate 20 defines a first and a second surface 21 and 22 and a peripheral edge 23. Although the substrate 20 is shown as a square, the present invention is not limited by the physical configuration of the substrate 20 as shown herein.

A thermal energy beam 40 is shown emanating from a source 42 and passing through the airtight transmission window 34 to impinge on the first surface 21 of the substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double $2\bar{\omega}$ Nd:YAG laser or an Excimer laser.

The thermal energy beam 40 is scanned in two dimensions across the first surface 21 of the substrate 20 to form the wide bandgap material 10. In this example, the wide bandgap material 10 is shown partially formed within the first surface 21 of the substrate 20 after a partial scan of the thermal energy beam 40 across the first surface 21 of the substrate 20.

The first surface 11 of the wide bandgap material 10 is coincident with the first surface 21 of the substrate 20 with the remainder of the wide bandgap material 10 including the second surface 12 and the peripheral surface 13 being embedded between first and second surfaces 21 and 22 of the substrate 20. It should be emphasized that all material interfaces are not discrete but are continuous or diffuse. Lines are used in the figures to show regions only as a convenience.

The substrate 20 may be formed as a monolith or a thin film substrate having suitable properties for forming the wide bandgap material 10. The non-wide bandgap material 15 has a bandgap equal to or less than two electron volts (2 eV). The wide bandgap bandgap material 10 has a bandgap greater than two electron volts (2 eV).

Preferably, the non-wide bandgap material 15 is sensitive to a thermal conversion process for transforming a layer of the non-wide bandgap material 15 into the wide bandgap material 10. In one example, the non-wide bandgap material 15 is selected from the group consisting of a silicon material (Si), a gallium arsenide material (GaAs), an alumina material ($Al_2O_3$), a silica material ($SiO_2$). Preferably, the non-wide bandgap material 15 is capable of being transformed from a non-wide bandgap material 15 into the wide bandgap material 10 and is capable of being subsequently transformed into an electrical component or device upon further irradiating by the thermal energy beam 40.

Table 1 contrasts various properties of two popular non-wide bandgap semiconductor materials namely silicon (Si) and gallium arsenide (GaAs) with wide bandgap semiconductors namely silicon carbide (SiC) and diamond.

TABLE 1

| Property | Silicon | Gallium Arsenide | 6H Silicon Carbide | Diamond |
| --- | --- | --- | --- | --- |
| Band Gap | 1.12 eV | 1.424 eV | 3 eV | 5.45 eV |
| Breakdown field | 0.3 MV/cm | 0.4 MV/cm | 3 MV/cm | 10 MV/cm |
| Dielectric constant | 11.7 | 12.9 | 10 | 5.5 |
| Thermal Conductivity | 130 W/K-cm | 55 W/K-cm | 500 W/K-cm | 2200 W/K-cm |
| Saturated electron drift velocity | $1 \times 10^7$ cm/sec | $1 \times 10^7$ cm/sec | $2 \times 10^7$ cm/sec | $2.7 \times 10^7$ cm/sec |

Table 1 illustrates the advantageous properties of wide bandgap materials 10. Unfortunately, wide bandgap materials 10 are currently expensive due to high processing costs and poor yields emanating from wafer growth through device packaging. The present invention trans-forms a layer of the non-wide bandgap material 15 into a wide bandgap material 10 to provide the advantages of the properties of the wide bandgap material 10 with the cost advantages of the non-wide bandgap material 15.

The present invention may utilize a conventional semiconductor material such as silicon (Si) or gallium arsenide (GaAs) as the non-wide bandgap material 15. In the alternative, the present invention may utilize a low cost ceramic material such as alumina ($Al_2O_3$) or a low cost glass material such as silica ($SiO_2$).

Figure 3:
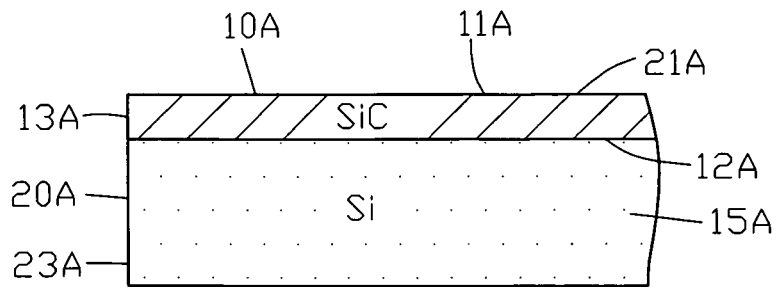
FIG. 3 is an enlarged partial sectional view of a first embodiment of silicon carbide (SiC) wide bandgap material formed in a silicon (Si) non-wide bandgap material.

FIG. 3 is an enlarged sectional view of a first embodiment of the invention illustrating a wide bandgap material 10A formed in the substrate 20A. In this example, the non-wide bandgap material 15A of the substrate 20A is a silicon (Si) material whereas the wide bandgap material 10A is silicon carbide (SiC).

The silicon (Si) non-wide bandgap material 15A is converted into the silicon carbide (SiC) wide bandgap material 10A as the thermal energy beam 40 scans across the first surface 21A of the substrate 20A. The thermal energy beam 40 scans across the first surface 21A of the substrate 20A in an atmosphere of methane gas or acetylene gas. The thermal energy beam 40 heats the silicon atoms of the non-wide bandgap material 15A. The heated silicon atoms of the non-wide bandgap material 15A react with the carbon atoms of the methane gas or acetylene gas atmosphere to create the silicon carbide (SiC) wide bandgap material 10A.

Figure 4:
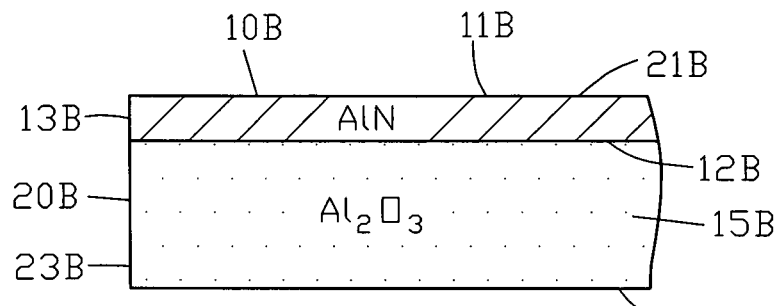
FIG. 4 is an enlarged partial sectional view of a second embodiment of an aluminum nitride (AlN) wide bandgap material formed in an alumina ($Al_2O_3$) non-wide bandgap material.

FIG. 4 is an enlarged sectional view of a second embodiment of the invention illustrating a wide bandgap material 10B formed in the substrate 20B. In this example, the non-wide bandgap material 15B of the substrate 20B is aluminum oxide ($Al_2O_3$) material whereas the wide bandgap material 10B is aluminum nitride (AlN).

The aluminum oxide ($Al_2O_3$) non-wide bandgap material 15B is converted into the aluminum nitride (AlN) wide bandgap material 10B as the thermal energy beam 40 scans across the first surface 21B of the substrate 20B. The thermal energy beam 40 scans across the first surface 21B of the substrate 20B in an atmosphere of nitrogen to create the aluminum nitride (AlN).

Gallium arsenide (GaAs) non-wide bandgap material (thermal conductivity 55 W/m-K) is converted to gallium nitride (GaN) wide bandgap material (thermal conductivity 130 W/m-K) by this method shown for converting aluminum oxide to aluminum nitride.

Typically, the formation of aluminum nitride (AlN) is not chemical and thermodynamically feasible because of the preferred affinity of aluminum for oxygen. A reacting getter such as source of heated carbon is used to remove the oxygen from reacting with the aluminum since oxygen has preferred reactions with carbon. The carbon can be a solid source or a gaseous source such as methane or acetylene. With the gaseous carbon sources the thermal energy beam 40 would be conducted under a mixed atmosphere of methane and nitrogen in simultaneous or subsequent steps.

The thermal carbon process described above or a similar process is used only when the chemistry of the existing substrate is more stable than that of the desired or new substrate surface composition. Once the oxygen is removed, the surface 21B of the substrate 20B can be scanned with the thermal energy beam 40 in the presence of a doping nitrogen gas to create aluminum nitride (AlN). Subsequently, the aluminum nitride (AlN) wide bandgap material 10B may be converted to semiconductors and conductors, or other device in accordance with the teaching of my previously mentioned U.S. Patents.

Figure 5:
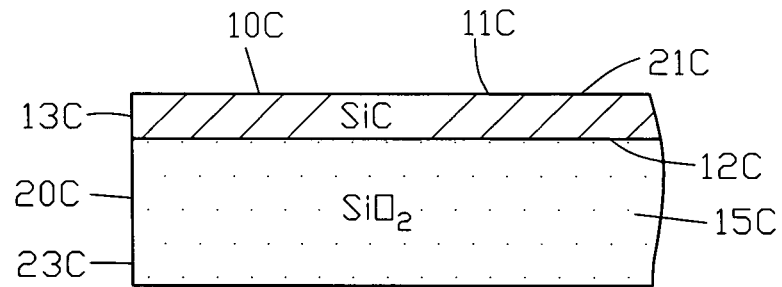
FIG. 5 is an enlarged partial sectional view of a third embodiment of a silicon carbide (SiC) wide bandgap material formed in a silica ($SiO_2$) non-wide bandgap material.

FIG. 5 is an enlarged sectional view of a third embodiment of the invention illustrating a wide bandgap material 10C formed in the substrate 20C. In this example, the non-wide bandgap material 15C of the substrate 20C is a silica ($SiO_2$) material whereas the wide bandgap material 10C is silicon carbide (SiC).

The silica ($SiO_2$) non-wide bandgap material 15C is converted into the silicon carbide (SiC) wide bandgap material 10C as the thermal energy beam 40 scans across the first surface 21C of the substrate 20C. The thermal energy beam 40 scans across the first surface 21C of the substrate 20C in an atmosphere of methane gas or acetylene gas. The thermal energy beam 40 heats the silicon atoms of the non-wide bandgap material 15C. The heated silicon atoms of the non-wide bandgap material 15C react with the carbon atoms of the methane gas or acetylene gas atmosphere to create the silicon carbide (SiC) wide bandgap material 10C.

Figure 6:
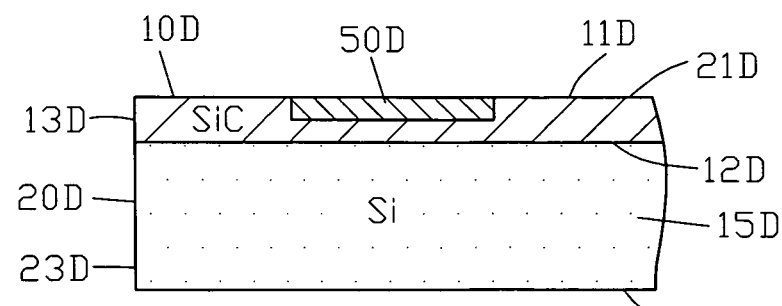
FIG. 6 is an enlarged partial sectional view of a fourth embodiment of a diamond like carbon material formed in the silicon carbide (SiC) wide bandgap material defined in a silicon (Si) non-wide bandgap material.

FIG. 6 is an enlarged sectional view of a fourth embodiment of the invention illustrating a component 50D defined in a wide bandgap material 10D formed in the substrate 20D. In this example, the component 50 D is a diamond like carbon material (DLC) formed in the silicon carbide (SiC) wide bandgap material 10D defined in a silicon (Si) non-wide bandgap material 15D. The silicon (Si) non-wide bandgap material 15D is converted into the silicon carbide (SiC) wide bandgap material 10D as the thermal energy beam 40 scans across the first surface 21D of the substrate 20D as set forth with reference to FIG. 3.

After the silicon (Si) non-wide bandgap material 15D is converted into the silicon carbide (SiC) wide bandgap material 10D, the silicon carbide (SiC) is converted into the diamond like carbon material (DLC) by selectively removing silicon atoms to create vacancies. The vacancies are then filled with carbon creating the diamond like carbon material (DLC). The thermal energy beam 40 irradiation of the SiC region in a $CO/CO_2$ containing atmosphere diffuses silicon to the surface where the silicon reacts with $CO_2$ to form SiO gas. An increased number of vacancies are left behind in the lattice.

An excimer laser (50 mJ/pulse, 10 Hz pulse repetition rate, 60 pulses, 193 nm wavelength, 20 ns pulse time, CO (partial pressure)/$CO_2$ (partial pressure)=$5\times10^4$) creates the temperature range 2000-2300° C. necessary to energize silicon (Si) self diffusion in silicon carbide (SiC). Carbon is then diffused into the substrate to fill the vacancies by laser irradiation, for example by (Nd:YAG, excimer etc.) in a methane or acetylene atmosphere to dissociate the hydrocarbon and drive (diffuse) atomic carbon into the silicon carbide (SiC) and if necessary orient or recrystallize the crystal structure.

Figure 7:
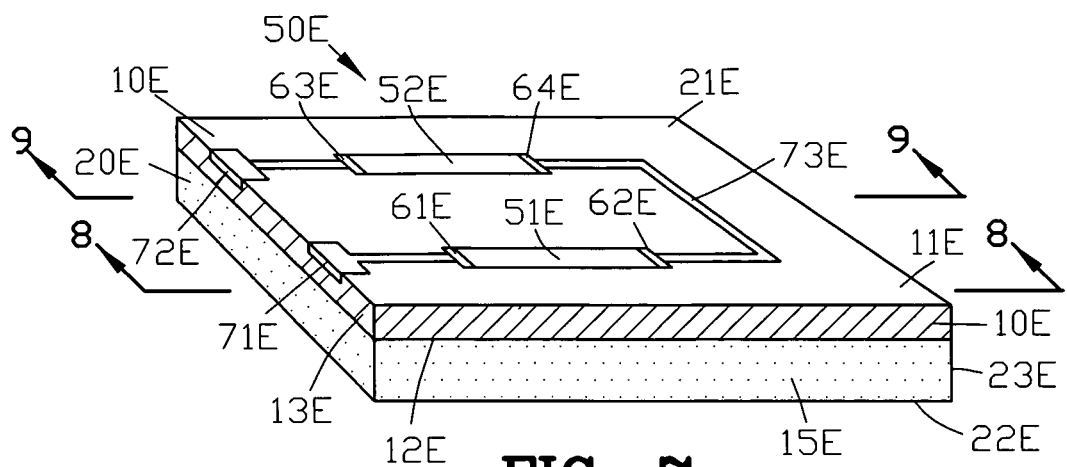
FIG. 7 is an enlarged isometric view of a fifth embodiment of an improved component formed in the wide bandgap material.

FIG. 7 is an enlarged isometric view of a fifth embodiment of the invention illustrating a semiconductor device 50E defined in the wide bandgap material 10E formed in the substrate 20E. The semiconductor device 50E may be one or more of a variety of devices such as an active or passive electrical device, a photonic device, an optical device, a sensor device, a spintronic device or any other suitable semiconductor device. In this example, the semiconductor device 50E is shown as a first semiconductor device 51E and a second semiconductor device 52E.

Figure 8:
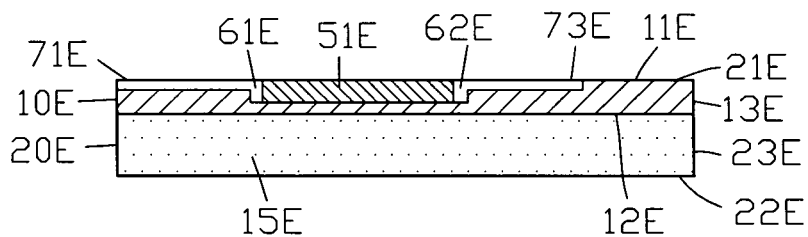
FIG. 8 is a sectional view along line 8-8 in FIG. 7.

FIG. 8 is a sectional view along line 8-8 in FIG. 7 illustrating the first semiconductor device 51E of FIG. 7. The first semiconductor device 51E is defined in the wide bandgap material 10E. The first semiconductor device 51E is connected by an electrode 61E to a first conductor 71E. An electrode 62E connects the first semiconductor device 51E to a connector 73E.

Figure 9:
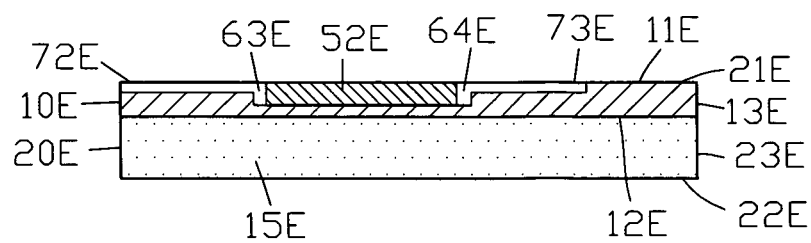
FIG. 9 is a sectional view along line 9-9 in FIG. 7.

FIG. 9 is a sectional view along line 9-9 in FIG. 7 illustrating the second semiconductor device 52E of FIG. 7. The second semiconductor device 52E is defined in the wide bandgap material 10E. The second semiconductor device 52E is connected by an electrode 63E to a second conductor 72E. An electrode 64E connects the second semiconductor device 52E to the connector 73E.

Preferably, the first and/or second semiconductor device 51E and 52E are formed in the wide bandgap material 10E by scanning the thermal energy beam 40 across selected portions of the wide bandgap material 10E in the presence of a doping atmosphere to form the first and/or second semiconductor device 51E and 52E. In the alternative, the first and/or second semiconductor device 51E and 52E may be formed in a conventional manner as should be well known in the art.

Figure 10:
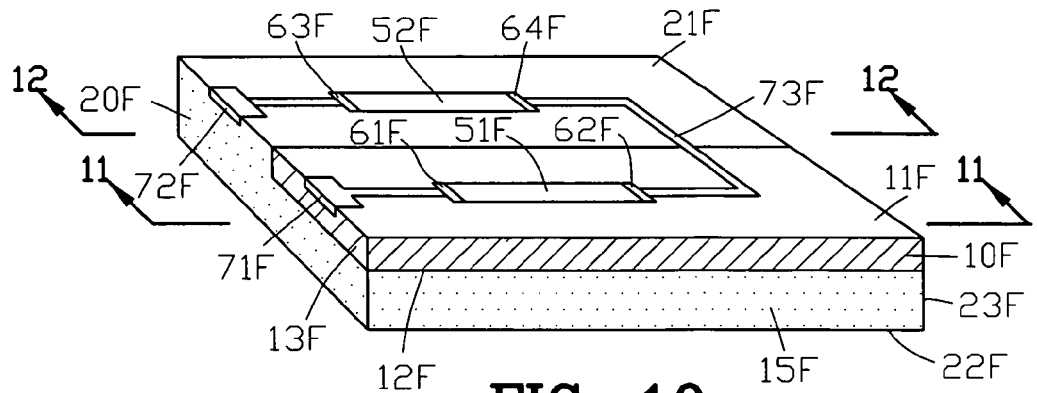
FIG. 10 is an enlarged isometric view of a sixth embodiment of an improved semiconductor device formed in the wide bandgap material.

FIG. 10 is an enlarged isometric view of a sixth embodiment of the invention illustrating a first semiconductor device 51F defined in the wide bandgap material 10F and a second semiconductor device 52F defined in the non-wide bandgap material 15F.

Figure 11:
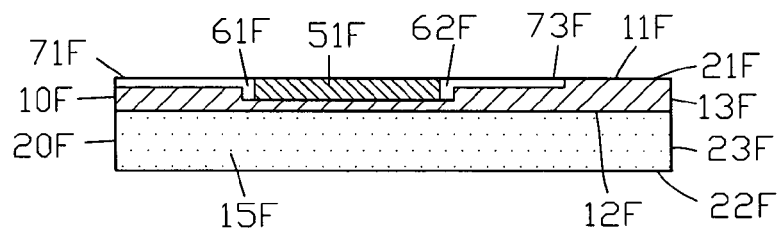
FIG. 11 is a sectional view along line 11-11 in FIG. 10.

FIG. 11 is a sectional view along line 11-11 in FIG. 10 illustrating the first semiconductor device 51F of FIG. 10. The first semiconductor device 51F is defined in the wide bandgap material 10F. The first semiconductor device 51F is connected by an electrode 61F to a first conductor 71F. An electrode 62F connects the first semiconductor device 51F to a connector 73F. The first semiconductor device 51F may be one or more of a variety of devices such as an active or passive electrical device, a photonic device, an optical device, a sensor device, a spintronic device or any other suitable semiconductor device.

Preferably, the first semiconductor device 51F is formed in the wide bandgap material 10F by scanning the thermal energy beam 40 across selected portions of the wide bandgap material 10F in the presence of a doping atmosphere to form the first semiconductor device 51F. In the alternative, the first semiconductor device 51F may be formed in a conventional manner as should be well known in the art.

Figure 12:
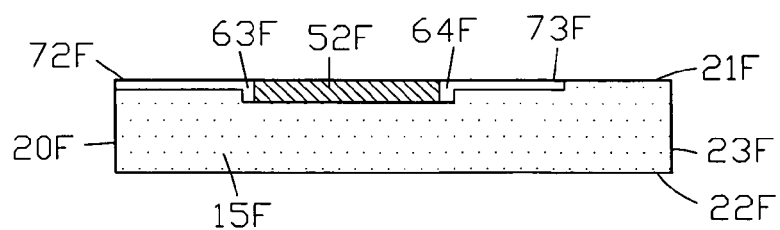
FIG. 12 is a sectional view along line 12-12 in FIG. 10.

FIG. 12 is a sectional view along line 12-12 in FIG. 10 illustrating the second semiconductor device 52F of FIG. 10. The second semiconductor device 52F is defined in the non-wide bandgap material 15F. The second semiconductor device 52F is connected by an electrode 63F to a second conductor 72F. An electrode 64F connects the second semiconductor device 52F to the connector 73F.

Preferably, the second semiconductor device 52F is formed in the non-wide bandgap material 15F in a conventional manner as should be well known in the art. In the alternative, the second semiconductor device 52F may be formed by scanning the thermal energy b earn 40 across selected portions of the non-wide bandgap material 15F in the presence of a doping atmosphere to form the second semiconductor device 52F.

The thermal energy beam 40 conversion and doping technology can be applied to the fabrication of conductors, different semiconductor and insulator phases in silicon carbide (SiC). Conductors can be fabricated by doping titanium into silicon carbide (SiC) by laser scanning in a titanium tetra chloride, or other titanium metallo-organic gas atmosphere. Different semiconductor phases can be created by scanning a material with the thermal energy beam 40 in an atmosphere of nitrogen (n-type), phosphine (n-type) or di-borane (p-type), trimethylaluminum (p-type) etc. Insulators can be created by scanning a material with the thermal energy beam 40 in an atmosphere of oxygen.

Figure 13:
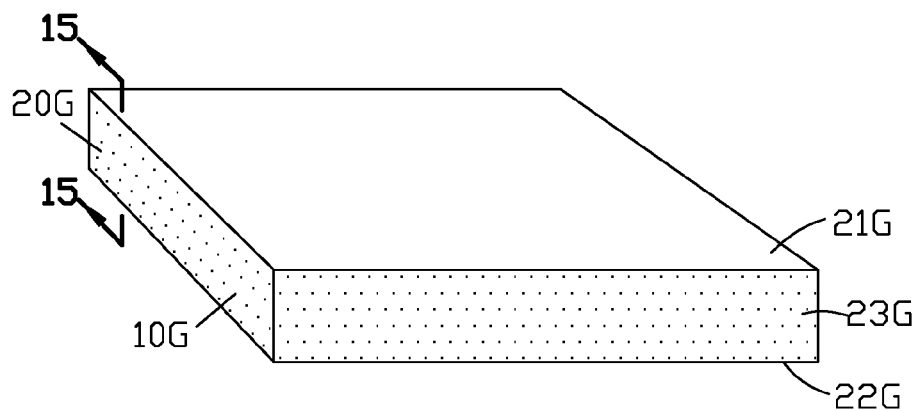
FIG. 13 is an enlarged isometric view of a seventh embodiment of the invention illustrating a substrate of a wide bandgap material having numerous lattice defects and/or lattice vacancies.

FIG. 13 is an enlarged isometric view of a seventh embodiment of the invention illustrating a substrate 20G of a wide bandgap material 10G. The substrate 20G defines a first and a second surface 21G and 22G and a peripheral edge 23G.

The substrate 20G is formed of a wide bandgap material 10G having a bandgap greater than two electron volts (2 eV). The wide bandgap material 10G is selected from the group consisting of a silicon carbide, aluminum nitride, boron nitride, gallium nitride and diamond, and diamond-like-carbon. In this example, the wide bandgap material 10G is shown as a low crystalline quality silicon carbide material.

The substrate 20G includes crystalline defects (not shown) within the wide bandgap material 10G. The crystalline defects in the wide bandgap material 10G may include numerous defects such as crystal lattice vacancies, substituted a toms, dislocations, stacking faults, micropipes and the like. The substrate 20G may be representative of commercially available wafers of wide bandgap material 10G that is not of sufficient crystalline quality for use as a defect free intrinsic semiconductor material. These defects may be detected by resistivity measurements; chemical analysis including secondary ion mass spectroscopy and energy dispersive spectra as well as high resolution transmission electron spectroscopy.

Figure 14:
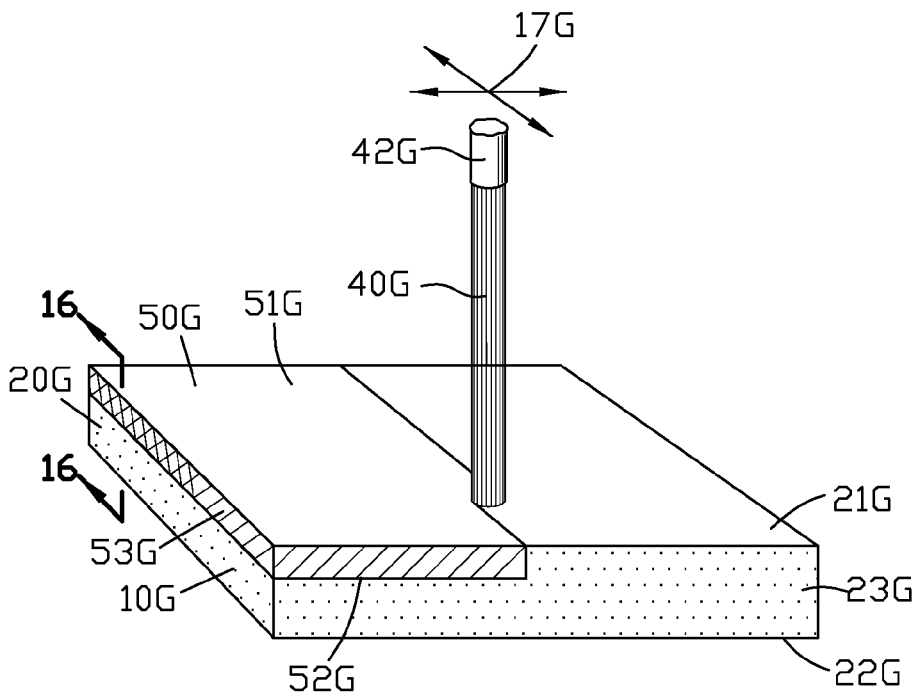
FIG. 14 illustrates the process of forming of a high crystalline quality layer (endolayer) within the silicon carbide substrate of FIG. 13.

FIG. 14 illustrates the process of forming a high crystalline quality layer 50G within the within the substrate 20G of FIG. 13. The high crystalline quality layer 50G is referred to as an endotaxial layer within the present detailed discussion. The high crystalline quality layer 50G endotaxial layer (endolayer) is an intrinsic semiconductor layer containing reduced defects, impurities and carrier concentrations compared to the substrate 20G (parent wafer) of the wide bandgap material 10G having the crystalline defects.

A doping gas is applied to the first surface 21G of the substrate 20G within the air-tight chamber 30G shown in FIG. 1. The doping gas has at least one element common to the wide bandgap material 10G. The one example, the doping gas is selected from the group consisting of silane, methane, acetylene, trimethyaluminum, nitrogen, diborane and triethyl gallium.

TABLE 2 list a number of examples of wide bandgap materials an appropriate doping gases for donating atoms to the crystalline defective wide bandgap material 10G to form the high crystalline quality layer 50G.

TABLE 2

| Wide Bandgap Material | Heavy Mass Atom (HMA) | Light Mass Atom (LMA) | Doping Gas (HMA) | Doping Gas (LMA) |
| --- | --- | --- | --- | --- |
| Silicon Carbide SiC | silicon | carbon | silane | Methane acetylene |
| Aluminum Nitride | Aluminum | Nitrogen | Tri-methyaluminum | Nitrogen |
| Boron Nitride | Nitrogen | Boron | Nitrogen | Diborane |
| Gallium Nitride | Gallium | Nitrogen | Triethyl gallium | Nitrogen |
| Diamond | Carbon | Carbon | Methane acetylene | Methane acetylene |

The metal-organics gases such as silane, trimethyaluminum, diborane and triethyl gallium may be used as a doping gas for the heavy mass atom (HMA) of Table 2. Typically the light mass atoms (LMA) are more mobile and have a higher diffusion coefficient than the heavy mass atoms (HMA). Most crystalline defects (not shown) within the wide bandgap material 10G will be corrected through the use of the doping gas for the light mass atom (LMA).

In the example of a substrate 20G formed from silicon carbide (n-type 6H—SiC with a nitrogen concentration of $5 \times 10^{18}$ atoms/$cm^3$) 10G. Carbon atoms (C) are inserted using methane (CHO, acetylene ($C_2H_2$) and other carbon sources. Similarly silicon atoms (Si) are inserted into the silicon carbide lattice using silane ($SiH_4$) or other metal-organic compound gas/vapor precursors.

The thermal energy beam 40G is scanned in two dimensions as indicated by the arrows 17G across the first surface 21G of the substrate 20G in the presence of the doping gas to form the high crystalline quality layer 50G within the substrate 20G. In this example, the high crystalline quality layer 50G is shown partially formed within the substrate 20G adjacent to the first surface 21G of the substrate 20G.

The thermal energy beam 40G is selected from the group consisting of a beam of charged particles, a beam of electrons, a beam of ions and a beam of electromagnetic radiation. In this example, the thermal energy beam 40G is shown as a laser beam. The thermal energy beam 40G continues to scan in two dimensions as indicated by the arrows 17G until the entire first surface 21G of the substrate 20G is converted into the high crystalline quality layer 50G.

TABLE 3 lists the operating parameters for a krypton fluoride (KrF) excimer laser and an argon fluoride (ArF) excimer laser for forming the high crystalline quality layer 50G in a substrate 20G of silicon carbide 10G.

TABLE 3

| Laser Type | KrF Excimer | ArF Excimer |
| --- | --- | --- |
| Wavelength (nm) | 248 | 193 |
| Pulse Energy (mJ) | 45 | 40 |
| Laser Fluence (J/cm$^2$) | 1.5 | 0.8 |
| Pulse Repetition Rate (kHz) | 1.0 | 1.0 |
| Number of Pulses | 600 | 600 |
| Beam Area (cm$^2$) | 0.1 × 0.3 | 0.2 × 0.25 |
| Scanning Plane (mm/s) | X – Y (surface) | |
| Atmosphere | Methane at 30 psi | |

The krypton fluoride (KrF) excimer laser has a high photo energy of 5.0 eV whereas the argon fluoride (ArF) excimer laser has a high photo energy of 6.4 eV. The high photo energy of either the krypton fluoride (KrF) excimer laser or the argon fluoride (ArF) excimer laser breaks the methane C—H bond (bond energy of 4.31 eV) and incorporates carbon atoms into the first surface 21G of the silicon carbide substrate 20G.

The high crystalline quality layer 50G defines a first and a second surface 51G and 52G and a peripheral edge 53G. The first surface 51G of the high crystalline quality layer 50G is coincident with the first surface 51G of the substrate 20G with the remainder of the high crystalline quality layer 50G being embedded within the substrate 20G between first and second surfaces 21G and 22G of the substrate 20G. The high crystalline quality layer 50G embedded within the substrate 20G provides a region suitable for use and processing as a defect free intrinsic wide bandgap semiconductor. It should be appreciated that the line interface separating the wide bandgap material 10G and the high crystalline quality layer 50G is for illustration purposes and the actual interface between the wide bandgap material 10G and the high crystalline quality layer 50G is a continuous or a diffuse interface.

The thermal energy beam 40G irradiates the substrate 20G in the presence of the doping gas to form the high crystalline quality layer 50G within the substrate 20G. One or more mechanisms may be present in the creating of the high crystalline quality layer 50G. In the example of a silicon carbide material (n-type 6H—SiC with a nitrogen concentration of 5×10$^{18}$ atoms/cm$^3$), one or more mechanisms may be present in the creating of the high crystalline quality layer 50G.

Firstly, impurity atoms such as nitrogen effuse (diffuse out as a gas) from the vacancy sites and lattice to the surface driven by the thermal energy beam. Secondly, carbon atoms are dissociated form a source such as methane by both pyrolytic and/or photolytic decomposition and diffuse, driven by the thermal energy beam into the substrate 20G. Thirdly, carbon atoms diffuse into vacancy sites to create intrinsic semiconductor bonds with silicon. The solid state diffusion and redistribution of atoms into the crystalline structure is driven by the thermal energy beam. Fourthly, the thermal energy beam removes all dislocations, stacking faults and micropipes from the region by annealing the area. Fifthly, a continuous or diffuse boundary between the substrate 20G and the high crystalline quality layer 50G behaves as a buffer preventing the re-introduction of mobile defects into the high crystalline quality layer 50G (endolayer).

The high crystalline quality layer 50G has uniform crystallographic orientation, uniform stoichiometry, high purity, approaching intrinsic semiconductor properties. The high crystalline quality layer 50G has a low defect density layer within a bulk grown single crystalline.

Figure 15:
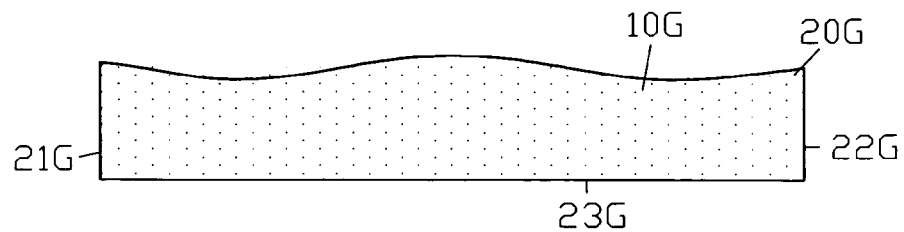
FIG. 15 is an enlarged sectional view along line 15-15 in FIG. 13 rotated ninety degrees counterclockwise.

FIG. 15 is an enlarged sectional view along line 15-15 of the substrate 20G in FIG. 13 rotated ninety degrees counterclockwise. The substrate 20G been rotated ninety degrees counterclockwise for the comparison with the graph shown in FIG. 17. The substrate 20G includes crystalline defects (not shown) within the wide bandgap material 10G.

Figure 16:
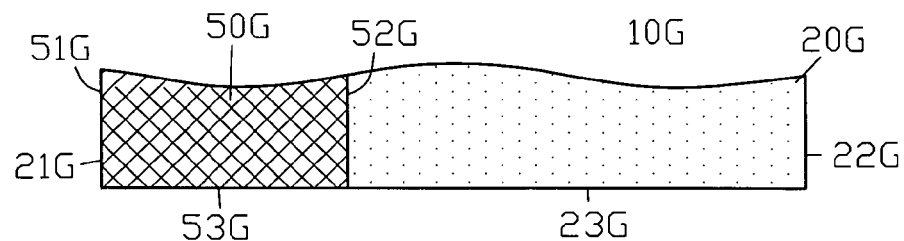
FIG. 16 is an enlarged sectional view along line 16-16 in FIG. 14 rotated ninety degrees counterclockwise.

FIG. 16 is an enlarged sectional view along line 16-16 of the substrate 20G and the high crystalline quality layer 50G in FIG. 14 rotated ninety degrees counterclockwise. The substrate 20G and the high crystalline quality layer 50G has been rotated ninety degrees counterclockwise for the comparison with the graph shown in FIG. 16.

Figure 17:
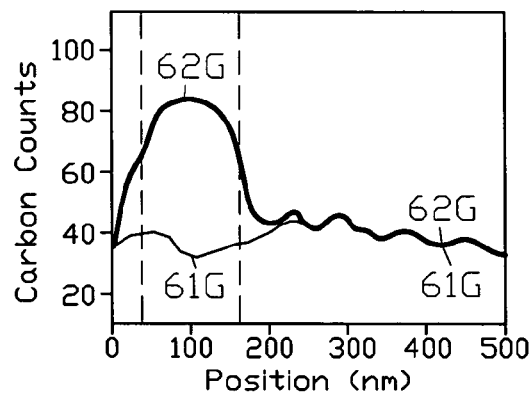
FIG. 17 is a graph of the energy dispersive spectra analysis of the substrate of FIG. 15 and the combined substrate and the high crystalline quality layer of FIG. 16.

FIG. 17 is a graph 61G of the energy dispersive spectra analysis of the silicon carbide substrate 20G of FIG. 15 and a graph 62G of the energy dispersive spectra analysis of the silicon carbide substrate 20G and the high crystalline quality layer (endolayer) of FIG. 16. Actual sample cross-sections as illustrated in FIGS. 15 and 16 were prepared by an FEI 200 TEM Focused Ion Beam (FIB). Transmission electron microscopy (TEM) studies were conducted using a FEI Tecnai F30 TEM using x-ray energy dispersive spectrometry (EDS) for carbon atomic analysis along the cross-section of the samples shown in FIGS. 15 and 16. The x-ray energy dispersive spectrometry (EDS) yields a carbon depth profile from the first surface 21G along a perpendicular depth into the substrate 20G.

The carbon concentrations at the near surface region along the cross-sections of the silicon carbide substrate 20G of FIG. 15 and the silicon carbide substrate 20G and the high crystalline quality layer (endolayer) of FIG. 16 are shown in FIG. 17.

Graph 61G illustrates a nearly constant carbon concentration in the silicon carbide substrate 20G of FIG. 15. Graph 62G illustrates a carbon-rich region in the silicon carbide substrate 20G and the high crystalline quality layer (endolayer) of FIG. 16. The carbon-rich region is bounded between two vertical dashed lines in FIG. 17, at the depths of 65 and 163 nm. It appears the high crystalline quality layer (endolayer) of FIG. 16 can be considered to be about 100 nm thick. The deep diffusion capability of the present invention allows location of the high crystalline quality layer (endolayer) of FIG. 16 at various depths within the substrate 20G enables the fabrication of embedded devices.

The thermal energy beam heats the silicon carbide substrate 20G only at the location of the high crystalline quality layer (endolayer) 50G. Aligned and random Rutherford Back-Scattering (RBS) channeling spectra of the silicon carbide substrate 20G of FIG. 15 and the silicon carbide substrate 20G and the high crystalline quality layer (endolayer) of FIG. 16 indicate that the process of the present invention does not induce damage to the underlying silicon carbide substrate 20G. In contrast, the process of forming an epitaxy layer heats the entire substrate. The heats the entire substrate is undesirable and may result in damage to the substrate.

TABLE 4 lists the resistivity of a silicon carbide substrate 20G having crystalline defects and the resistivity of the high crystalline quality layer 50G compared with the resistivity of intrinsic (pure) silicon.

TABLE 4

| Samples | Resistivity ρ (Ωcm) |
|---|---|
| Silicon Carbide Substrate With Crystalline Defects | 1.55 |
| Endotaxial Layer High Crystalline Quality Layer | $1.1 \times 10^5$ |
| Silicon Single Crystal Intrinsic (pure) | $2.3 \times 10^5$ |

The resistivity of the silicon carbide high crystalline quality layer (endotaxial layer) 50G is $1.1 \times 10^5$ Ωcm, above the resistivity $10^4$ Ωcm needed for semiconductor device isolation and high voltage blocking. A n-type semiconductor material may be formed in the silicon carbide high crystalline quality layer (endotaxial layer) 50H by further laser irradiation in the presence of nitrogen dope gas. A p-type semiconductor material may be formed in the silicon carbide high crystalline quality layer (endotaxial layer) 50H by further laser irradiation in the presence of a trimethylaluminum vapor.

Figure 18:
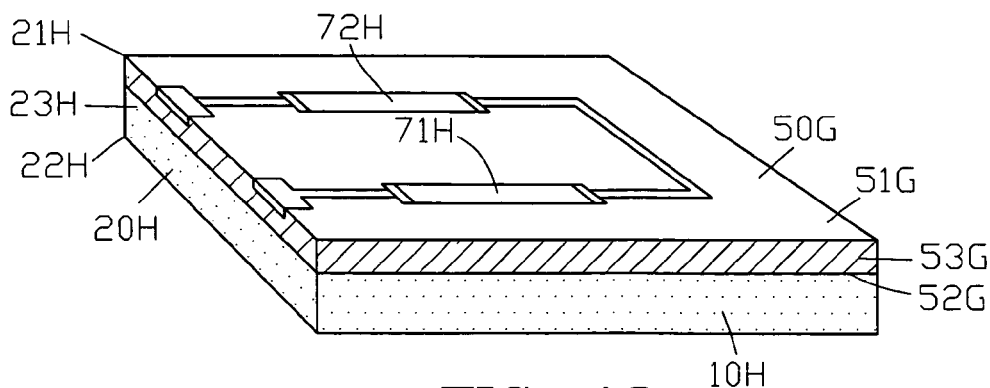
FIG. 18 is an enlarged isometric view of an eighth embodiment of the invention illustrating a semiconductor device defined in the high crystalline quality layer (endolayer) of FIG. 14.

FIG. 18 is an enlarged isometric view of an eighth embodiment of the invention illustrating further processing of the high crystalline quality layer (endotaxial layer) 50H of the substrate 20H. In another example, the further processing of the high crystalline quality layer (endotaxial layer) 50H creates semiconductor devices 71H and 72H defined in the high crystalline quality layer 50H formed in the substrate 20H. The semiconductor devices 71H and 72H may be one or more of a variety of devices such as an active or passive electrical device, a photonic device, an optical device, a sensor device, a spintronic device or any other suitable semiconductor device. Preferably, the semiconductor device 71E and 72E are formed in the high crystalline quality layer 50H by scanning the thermal energy beam 40 across selected portions of the high crystalline quality layer 50H in the presence of a doping atmosphere to form the semiconductor device 71H and 72H. In the alternative, the semiconductor device 71H and 72H may be formed in a conventional manner as should be well known in the art.

The formation of the semiconductor devices 71H and 72H in the high crystalline quality layer 50H provides many advantages over the prior art. The formation of the semiconductor devices 71H and 72H in the high crystalline quality layer 50H eliminates parasitic electronic effects as well as improves thermal conductivity thus enabling the creation of more devices per unit volume. The formation of the semiconductor devices 71H and 72H in the high crystalline quality layer 50H eliminates impurities, micropipes and other defects that result in poor device performance.

The present invention provides an apparatus and method for forming a high crystalline quality layer (endolayer) within a wide bandgap substrate. The high crystalline quality layer (endolayer) is formed in situ to be integral within the wide bandgap substrate. The high crystalline quality layer (endolayer) is suitable for use as a defect free intrinsic semiconductor material. A semiconductor component may be fabricated within the high crystalline quality layer (endolayer) by a laser synthesis process or a conventional process.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method of reducing crystalline defects within an internal region of a silicon carbide wide bandgap semiconductor to form a high crystalline quality internal region comprising:
    providing a silicon carbide material having crystalline vacancies containing nitrogen impurity defined between a first outer surface and a second inner substrate surface;
    irradiating the first outer surface of the silicon carbide wide bandgap semiconductor with an ultraviolet laser to effuse nitrogen from vacancies in the silicon carbide wide bandgap semiconductor;
    applying a doping gas having a carbon-hydrogen (C—H) bond; and
    continuing irradiation by the ultraviolet laser for photolytically decomposing carbon-hydrogen (C—H) bond to produce free carbon atoms from the doping gas to diffuse the carbon atoms into the vacancies in the silicon carbide wide bandgap semiconductor;
    further irradiating the silicon carbide wide bandgap semiconductor to anneal the silicon carbide wide bandgap semiconductor to remove dislocations, stacking faults and micropipes; and
    continuing irradiating the silicon carbide wide bandgap semiconductor to create a continuous or diffuse boundary to prevent the re-introduction of mobile defects.

2. A method of reducing crystalline defects within an internal region of a silicon carbide wide bandgap semiconductor as set forth in claim 1, wherein the laser is selected from the group consisting of KrF or ArF excimer laser.

3. A method of reducing crystalline defects within an internal region of a silicon carbide wide bandgap semiconductor as set forth in claim 1, wherein laser has a high photo energy greater than 4.31 eV.

4. A method of reducing crystalline defects within an internal region of a silicon carbide wide bandgap semiconductor as set forth in claim 1, wherein laser has a pulse energy of 40 mJ or greater.

5. A method of reducing crystalline defects within an internal region of a silicon carbide wide bandgap semiconductor as set forth in claim 1, wherein laser has a fluence of 800 mJ/cm2 or greater.

6. A method of reducing crystalline defects within an internal region of a silicon carbide wide bandgap semiconductor as set forth in claim 1, wherein laser has a fluence of 800 mJ/cm$^2$ or greater.

7. A method of reducing crystalline defects within an internal region of a silicon carbide wide bandgap semiconductor as set forth in claim 1, wherein laser has a number on the order of 600 pulses.

8. A method of reducing crystalline defects within an internal region of a silicon carbide wide bandgap semiconductor as set forth in claim 1, wherein an internal region of the silicon carbide wide bandgap semiconductor having a resisitivity on the order of 100000 ohm-cm is fabricated with the defective silicon carbide wide bandgap semiconductor having a resistivity on the order of 1.5 ohm-cm.

* * * * *